United States Patent
Yamamoto

(10) Patent No.: US 7,289,780 B2
(45) Date of Patent: Oct. 30, 2007

(54) BAND SWITCHABLE TYPE TUNING CIRCUIT OF TELEVISION SIGNAL

(75) Inventor: Masaki Yamamoto, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 387 days.

(21) Appl. No.: 10/991,072

(22) Filed: Nov. 17, 2004

(65) Prior Publication Data

US 2005/0113051 A1   May 26, 2005

(30) Foreign Application Priority Data

Nov. 21, 2003   (JP) .............................. 2003-272653

(51) Int. Cl.
   *H04B 1/18*   (2006.01)
(52) U.S. Cl. ............... 455/180.4; 455/188.2; 455/180.2; 455/187.1; 455/187.2; 348/731; 348/725; 348/733; 348/729; 348/730; 348/705
(58) Field of Classification Search ............ 455/179.1, 455/180.2, 180.4, 188.1, 188.2, 191.1, 191.2, 455/191.3, 187.1, 178.1, 180.1; 348/731, 348/725, 15, 554, 733, 732, 729, 735, 730, 348/705, 723, 726, 728
See application file for complete search history.

(56) References Cited

U.S. PATENT DOCUMENTS

| | | | |
|---|---|---|---|
| 3,892,983 A * | 7/1975 | Okada et al. ............... 327/487 |
| 3,896,403 A * | 7/1975 | Ma ............................. 334/15 |
| 4,305,158 A * | 12/1981 | Fujishima et al. ....... 455/187.1 |
| 4,461,038 A | 7/1984 | Miyoshi |
| 4,771,332 A * | 9/1988 | Metoki ....................... 348/731 |
| 4,985,772 A * | 1/1991 | Long et al. ................. 348/554 |
| 2002/0063804 A1* | 5/2002 | Yamamoto .................. 348/725 |
| 2002/0075414 A1* | 6/2002 | Yamamoto .................. 348/731 |
| 2002/0176027 A1* | 11/2002 | Yamamoto .................. 348/736 |
| 2002/0186326 A1* | 12/2002 | Yamamoto .................. 348/731 |
| 2003/0076449 A1* | 4/2003 | Yamamoto .................. 348/731 |
| 2003/0193620 A1* | 10/2003 | Yamamoto .................. 348/731 |

FOREIGN PATENT DOCUMENTS

JP   2003-124786 A2   4/2003

* cited by examiner

*Primary Examiner*—Nay Maung
*Assistant Examiner*—Junpeng Chen
(74) *Attorney, Agent, or Firm*—Brinks Hofer Gilson & Lione

(57) ABSTRACT

A band switchable type tuning circuit has first switch means interposed between a power supply Vcc and an anode of a switch diode, a first resistor whose one end is connected to a cathode of the switch diode, second switch means interposed between the other end of the first resistor and a ground, a second resistor connected between the power supply Vcc and a connection point of the first resistor and the second switch means, and the third resistor connected between the ground and a connection point of the first switch means and the anode of the switch diode. The first switch means and the second switch means are turned on or off together by means of a band switching voltage.

3 Claims, 3 Drawing Sheets

BAND SWITCHABLE TYPE TUNING CIRCUIT OF TELEVISION SIGNAL

This application claims the benefit of priority to Japanese Patent Application No. 2003-272653 filed on Nov. 21, 2003, herein incorporated by reference.

BACKGROUND OF THE INVENTION

1. Field of the Invention

The present invention relates to a band switchable type tuning circuit which is adapted to tune to television signals of a high band or a low band.

2. Description of the Related Art

FIG. 5 shows a conventional band switchable type input tuning circuit. Television signals of a VHF band and a UHF band are input to a VHF input tuning circuit 22 and a UHF input tuning circuit 23 via a trap circuit 21 which eliminates unnecessary signals such as FM broadcast signals.

The VHF input tuning circuit 22 has a tuning varactor diode 22a whose anode is grounded, four coils, that is, a high-band coil 22b, a low-band coil 22c, a low-band coil 22d and a high-band coil 22e which are sequentially connected in series to a cathode of the tuning varactor diode 22a and which are connected in parallel to the tuning varactor diode 22a, and a switch diode 22f is connected in parallel with the two low-band coils 22c and 22d. The high-band coil 22e of a low potential side is grounded by a direct current (DC)-cutting capacitor 22g. And then, the television signals are input to a connection point of the two low-band coils 22c and 22d. Further, a connection point of the cathode of the tuning varactor diode 22a and the high-band coil 22b serves as an output terminal of the VHF input tuning circuit 22.

Also, a connection point of the high-band coil 22e and the DC-cutting capacitor 22g is grounded via a resistor 22h and is connected to a power supply terminal B via a resistor 22i. A power supply voltage of 5V is applied to the power supply terminal B. And then, the power supply voltage is divided by the resistors 22h and 22i, and the divided bias voltage is applied to an anode of the switch diode 22f via the high-band coil 22e and the low-band coils 22d and 22c. In addition, a cathode of the switch diode 22f is connected to a band switching terminal Sw via a resistor 22j. To the band switching terminal Sw, a switching voltage of a high level (5 V) or a low level (0 V) is applied. Further, the cathode of the tuning varactor diode 22a is connected to a tuning voltage terminal Tu via the high-band coil 22b. To the tuning voltage terminal Tu, a tuning voltage is applied.

In a stage next to the VHF input tuning circuit 22, a VHF radio frequency amplifier 24 is provided. The VHF input tuning circuit 22 and the VHF radio frequency amplifier are coupled by a coupling varactor diode 25. The coupling varactor diode 25 has the same characteristic as that of the tuning varactor diode 22a. A cathode of the coupling varactor diode 25 thereof is connected to the cathode of the tuning varactor diode 22a. Further, an anode thereof is grounded via a resistor 26 and is connected to an input terminal of the VHF radio frequency amplifier 24 via a DC-cutting capacitor 27.

The UHF input tuning circuit 23 has a coil 23a whose one end is grounded, and two tuning varactor diodes 23b and 23c of which cathodes are connected to each other and which have the same characteristic. An anode of the tuning varactor diode 23b is connected to the other end of the coil 23a and an anode of the tuning varactor diode 23c is grounded via a DC-cutting capacitor 23d and a resistor 23e. And then, a connection point of the coil 23a and the anode of the tuning varactor diode 23b is connected to the trap circuit 21 via a DC-cutting capacitor 31. Further, the cathodes of the two tuning varactor diodes 23b and 23c are connected to the tuning voltage terminal Tu while being connected to a UHF radio frequency amplifier 33 via a DC-cutting capacitor 32. For the UHF radio frequency amplifier 33, an FET is also used.

In a stage next to the UHF radio frequency amplifier 33, a UHF inter-stage tuning circuit 34 is provided.

In such a configuration, when the television signal of the VHF band is received, the VHF radio frequency amplifier 24 enters an enable state and the UHF radio frequency amplifier 33 enters a disable state. Meanwhile, when the television signal of the UHF band is received, the UHF radio frequency amplifier 33 becomes the enable state and the VHF radio frequency amplifier 24 becomes the disable state.

First, when the television signal of the VHF band is received, a voltage of the band switching terminal Sw becomes low level. If so, the switch diode 22f is turned on, and then the VHF input tuning circuit 22 is constructed by the two high-band coils 22b and 22e and the tuning varactor diode 22a. And then, a tuning frequency changes within the high band according to the tuning voltage to be applied to the cathode of the tuning varactor diode 22a.

Meanwhile, when the television signal of the VHF band is received, the voltage of the band switching terminal Sw becomes high level. If so, the switch diode 22f is turned off, and the VHF input tuning circuit 22 is constructed by the two high-band coils 22b and 22e, the two low-band coils 22c and 22d, and the tuning varactor diode 22a. In this case, the tuning frequency changes within the low band according to the tuning voltage to be applied to the cathode of the tuning varactor diode 22a (for example, see Japanese Unexamined Patent Application Publication No. 2003-124786 (FIG. 5)).

In the above-mentioned configuration, the power supply voltage is divided by the resistors 22h and 22i and the divided bias voltage is applied to the anode of the switch diode 22f. Further, the cathode of the switch diode 22f is connected to the low level voltage (0 V) via the resistor 22j. Thus, when the switch diode 22f is turned on, a large current does not flow. Therefore, there are problems in that an on resistance of the switch diode is high and a Q of the VHF input tuning circuit 22 is lowered. Further, when the switch diode 22f is turned off, a reverse bias voltage becomes small. Therefore, there are problems in that a capacitance between the terminals of the switch diode 22f is high and the tuning frequency range of the VHF input tuning circuit 22 is limited.

SUMMARY OF THE INVENTION

It is an object of the present invention to provide a band switchable type tuning circuit in which, when a switch diode is turned on, a large current flows, and when the switch diode is turned off, a reverse bias voltage becomes large.

In order to solve the above problems, according to the present invention, there is provided a band switchable type tuning circuit comprising a plurality of tuning coils, a varactor diode constituting a parallel tuning circuit with the tuning coils, a switch diode for switching inductances of the tuning coils with being turned on or off, first switch means interposed between a power supply and an anode of the switch diode, a first resistor whose one end is connected to a cathode of the switch diode, second switching means interposed between the other end of the first resistor and a ground, a second resistor connected between a connection point of the first resistor and the second switch means, and the power supply, and a third resistor connected between a connection point of the first switch means and the anode of the switch diode, and the ground, in which the first switch means and the second switch means are turned on or off together by a band switching voltage.

Further, the first switch means comprises a PNP transistor whose emitter is connected to the power supply and the second switch means comprises a NPN transistor whose emitter is grounded. And then, a collector of the PNP transistor is connected to the anode of the switch diode and a collector of the NPN transistor is connected to the other end of the first resistor. In addition, a base of the PNP transistor is connected to the collector of the NPN transistor and the band switching voltage is applied to a base of the NPN transistor.

Further, the first switch means, the second switch means, the second resistor and the third resistor are provided in an integrated circuit.

In the present invention, the first switch means interposed between the power supply and the anode of the switch diode, the first resistor whose one end is connected to the cathode of the switch diode, and the second switch means interposed between the other end of the first resistor and the ground are provided. Further, the second resistor connected between the power supply and the connection point of the first resistor and the second switch means, and the third resistor connected between the ground and the connection point of the first switch means and the anode of the switch diode are provided. Here, the first switch means and the second switch means are turned on or off together by a band switching voltage. Thus, when the two switch means are turned off, the switch diode is reverse-biased by the power supply voltage to be turned off, such that a capacitance between the terminals of the switch diode becomes small. Meanwhile, when the two switch means are turned on, the switch diode is forward-biased to the power supply to be turned on. In the case, however, the value of a forward current is determined by only the first resistor. Thus, a sufficient current can flow and an on resistance can be lowered.

Further, the first switch means comprises the PNP transistor whose emitter is connected to the power supply, and the second switch means comprises the NPN transistor whose emitter is grounded. Further, the collector of the PNP transistor is connected to the anode of the switch diode, and the collector of the NPN transistor is connected to the other end of the first resistor. In addition, the base of the PNP transistor is connected to the collector of the NPN transistor, and the band switching voltage is applied to the base of the NPN transistor. Thus, it is possible to allow the switch diode to be turned on/off only by turning on/off of the NPN transistor.

Further, the first switch means, the second switch means, the second resistor, and the third resistor are provided in the integrated circuit. Thus, a configuration for switching the switch diode becomes simple.

DESCRIPTION OF THE PREFERRED EMBODIMENT

Figure 1:
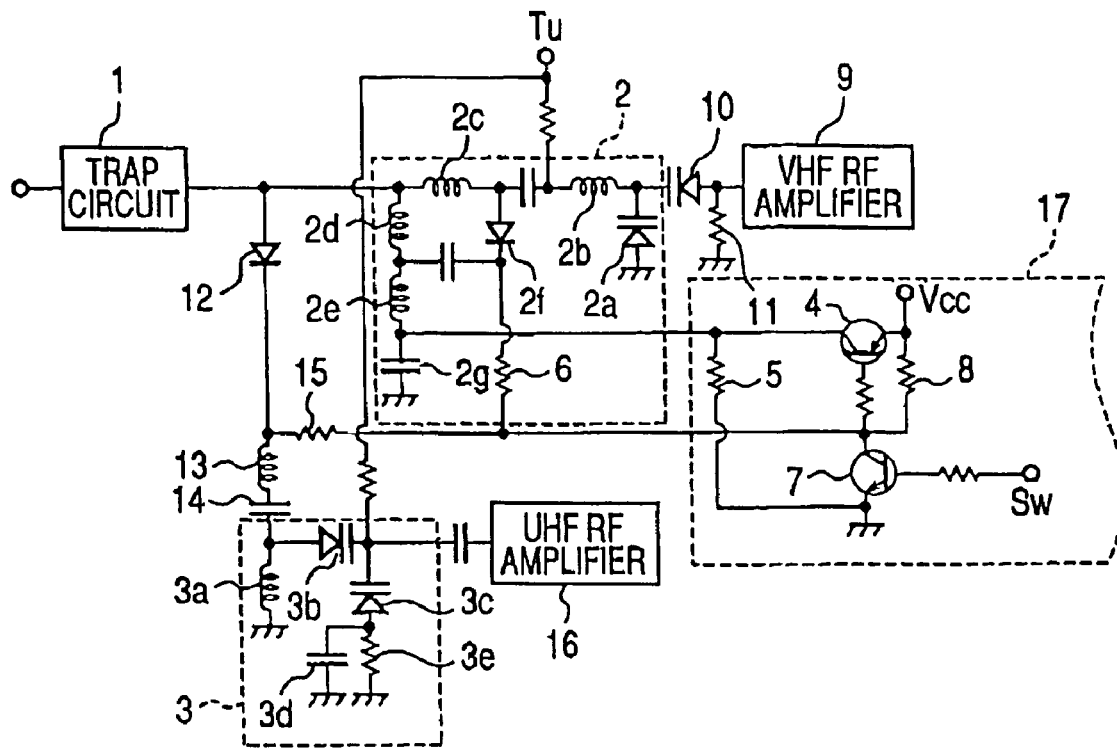
FIG. 1 is a circuit diagram showing a configuration of a band switchable type tuning circuit according to the present invention.

FIG. 1 shows a band switchable type input tuning circuit according to the present invention. Television signals of a VHF band and a UHF band are input to a VHF input tuning circuit 2 and a UHF input tuning circuit 3 via a trap circuit 1 which eliminates unnecessary signals such as FM broadcast signals.

The VHF input tuning circuit 2 has a tuning varactor diode 2a whose anode is grounded, four coils, that is, a high-band coil 2b, a low-band coil 2c, a low-band coil 2d and a high-band coil 2e, which are sequentially connected in series to a cathode of the tuning varactor diode 2a and which are connected in parallel to the tuning varactor diode 2a; and a switch diode 2f which is connected in parallel with the two low-band coils 2c and 2d. The high-band coil 2e of a low potential side is grounded via a direct current (DC)-cutting capacitor 2g. Here, to a connection point of the two low-band coils 2c and 2d, the television signals are input. Further, a connection point of the cathode of the tuning varactor diode 2a and the high-band coil 2b serves as an output terminal of the VHF input tuning circuit 2.

Further, a connection point of the high-band coil 2e and the DC-cutting capacitor 2g is connected to a power supply Vcc via a first switch means 4. The voltage of the power supply Vcc is 5V. The first switch means 4 comprises a PNP transistor. An emitter of the first switch means 4 is connected to the power supply Vcc. Further, a collector of the first switch means 4 is connected to the connection point of the high-band coil 2e and the DC-cutting capacitor 2g and is connected to a ground via a third resistor 5.

Further, a cathode of the switch diode 2f is connected to one end of a first resistor 6 and the other end of the first resistor 6 is connected to the ground via a second switch means 7. The second switch means 7 comprises a NPN transistor. An emitter of the second switch means 7 is grounded. Further, a collector of the second switch means 7 is connected to the other end of the first resistor 6 and is pulled-up to the power supply Vcc via a second resistor 8. To a base of the second switch means 7, a band switching voltage Sw is applied. The band switching voltage Sw is switched to a high level (5 V) or a low level (0 V). And then, a base of the PNP transistor constituting the first switch means 4 is connected to the collector of the NPN transistor constituting the second switch means 7.

Moreover, the first switch means 4, the second switch means 7, the second resistor 8, and the third resistor 5 are provided in an integrated circuit 17.

Further, to the cathode of the tuning varactor diode 2a, a tuning voltage Tu is applied via the high-band coil 2b.

In a stage next to the VHF input tuning circuit 2, a VHF radio frequency amplifier 9 is provided, and the VHF input tuning circuit 2 and the VHF radio frequency amplifier 9 are coupled by a coupling varactor diode 10. The coupling varactor diode 10 has the same characteristic as that of the tuning varactor diode 2a. A cathode of the coupling varactor diode 10 is connected to the cathode of the tuning varactor diode 2a and an anode thereof is grounded via a resistor 11.

The UHF input tuning circuit 3 has a coil 3a whose one end is grounded, and two tuning varactor diodes 3b and 3c of which cathodes are connected to each other and which have the same characteristic. An anode of the tuning varactor diode 3b is connected to the other end of the coil 3a, and an anode of the tuning varactor diode 3c is grounded via a DC-cutting capacitor 3d and a resistor 3e. And then, the UHF input tuning circuit 3 is coupled to the trap circuit 1 via a series circuit comprising a switch diode 12, an inductance element 13, and a DC-cutting capacitor 14. In this case, however, an anode of the switch diode 12 is connected to the connection point of the two low-band coils 2c and 2d, and then it is also connected in series to an anode of the switch diode 2f via the low-band coil 2c. Further, a cathode of the switch diode 12 is connected to the collector of the NPN transistor serving as the second switch means 7 via a first resistor 15.

The tuning voltage Tu is also applied to the cathodes of the two tuning varactor diodes 3b and 3c. Further, the cathodes of the two tuning varactor diodes 3b and 3c are connected to a UHF radio frequency amplifier 16.

Figure 2:
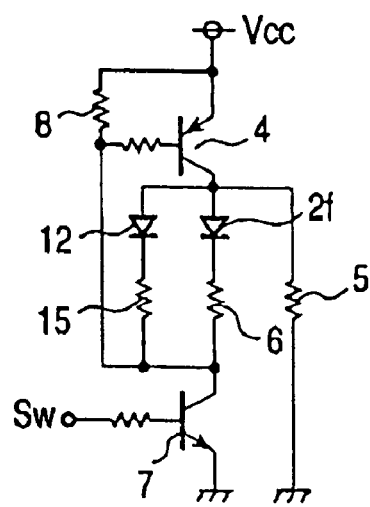
FIG. 2 is a direct current (DC) circuit diagram showing the band switchable type tuning circuit according to the preset invention.

In the VHF input tuning circuit 2 described above, a direct current (DC) circuit comprising the switch diode 2f and the switch diode 12 which couples the trap circuit 1 and the UHF input tuning circuit 3 is as shown in FIG. 2. That is, the PNP transistor serving as the first switch means 4 is interposed between the power supply Vcc and the anodes of the switch diodes 2f and 12. To the cathodes of the switch diodes 2f and 12, one ends of the first resistors 6 and 15 are connected respectively. Further, between the other ends of the first resistors 6 and 15 and the ground, the NPN transistor serving as the second switch means is interposed. Further, the second resistor 8 is connected between the power supply Vcc and a connection point of the second switch means 7 and the first resistors 6 and 15, and the third resistor 5 is connected between the ground and a connection point between the first switch means 4 and the anodes of the switch diodes 2f and 12.

In such a configuration, when the television signal of the VHF band is received, the VHF radio frequency amplifier 9 becomes an enable state and the UHF radio frequency amplifier 16 becomes a disable state. Meanwhile, when the television signal of the UHF band is received, the UHF radio frequency amplifier 16 becomes the enable state and the VHF radio frequency amplifier 9 becomes the disable state.

Figure 3:
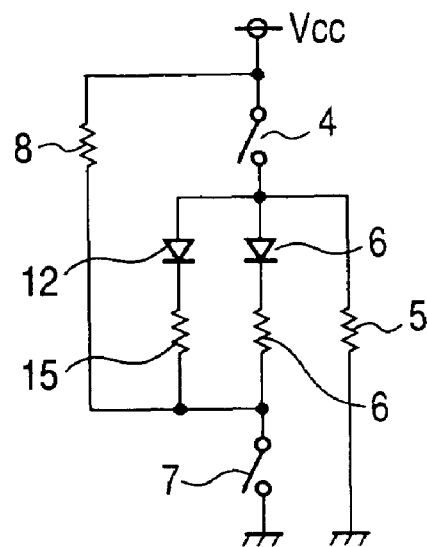
FIG. 3 is a DC circuit diagram showing the band switchable type tuning circuit according to the preset invention.

First, when the television signal of the low band belonging to the VHF band is received, a low level band switching voltage is applied to the base of the NPN transistor constituting the second switch means 7. If so, the second switch means 7 is turned off, and then the first switch means 4 is also turned off. Thus, as shown in FIG. 3, the voltage from the power supply Vcc is applied to the cathodes of the switch diodes 2f and 12 through the second resistor 8 and the first resistors 6 and 15. Also, the anodes of the switch diodes 2f and 12 are grounded via the third resistor 5. Therefore, the switch diodes 2f and 12 are reverse-biased by the voltage from the power supply Vcc to be turned off, such that the capacitance between the terminals of the switch diodes 2f and 12 become small. And then, if the switch diode 2f is turned off, the four coils 2b to 2e constitute a parallel tuning circuit with the tuning varactor diode 2a. As a result, the band switchable type tuning circuit is tuned to the television signal of the low band.

Figure 4:
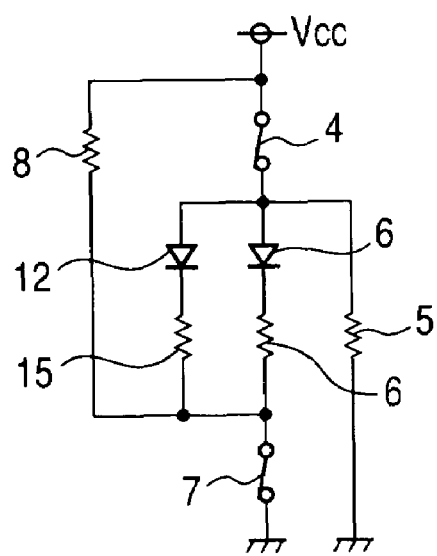
FIG. 4 is a DC circuit diagram showing the band switchable type tuning circuit according to the preset invention.
Figure 5:
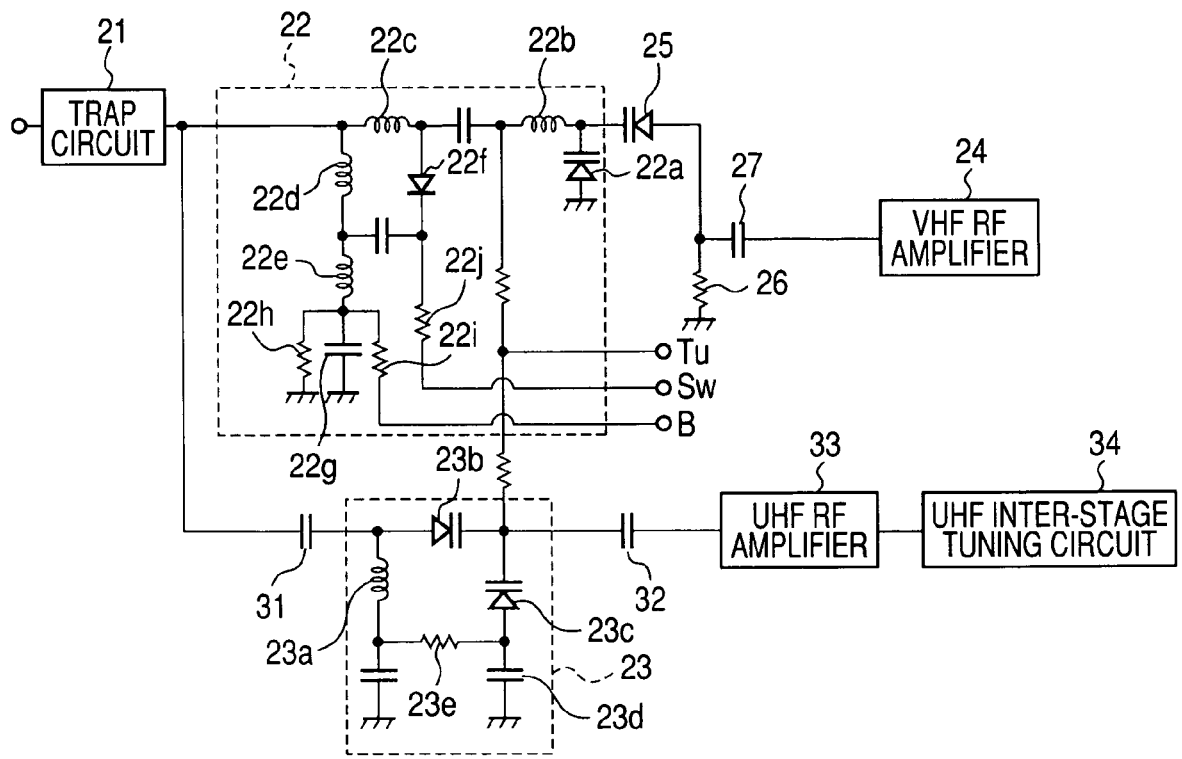
FIG. 5 is a circuit diagram showing a configuration of a conventional band switchable type tuning circuit.

Meanwhile, when the television signal of the high band belonging to the VHF band is received, a high level band switching voltage is applied to the base of the NPN transistor constituting the second switch means 7. If so, the second switch means 7 is turned on, and then the first switch means 4 is also turned on. Thus, as shown in FIG. 4, the voltage from the power supply Vcc is applied to the anodes of the switch diodes 2f and 12. Further, the cathodes of the switch diodes 2f and 12 are grounded via the first resistors 6 and 15 respectively. Therefore, the switch diodes 2f and 12 are forward-biased to the power supply Vcc to be turned on. In this case, a forward current is determined by only the first resistors 6 and 15. Thus, the sufficient current can flow and the on resistance can be lowered.

Moreover, in the present invention, a case in which the band switchable type tuning circuit is applied to the input tuning circuit is described. However, it is needless to say that the present invention may be applied to the whole field of the tuning circuit, such as an inter-stage tuning circuit, which switches to be tuned to two bands by means of the switch diodes.

What is claimed is:

1. A band switchable type tuning circuit comprising:
   a plurality of tuning coils;
   a varactor diode constituting a parallel tuning circuit with the tuning coils;
   a switch diode for switching inductances of the tuning coils;
   first switch means interposed between a power supply and an anode of the switch diode;
   a first resistor whose one end is connected to a cathode of the switch diode;
   second switch means interposed between the other end of the first resistor and a ground;
   a second resistor connected between a connection point of the first resistor and the second switch means, and the power supply; and
   a third resistor connected between a connection point of the first switch means and the anode of the switch diode, and the ground,
   wherein the first switch means and the second switch means are simultaneously turned on or off by a band switching voltage.

2. The band switchable type tuning circuit according to claim 1,
   wherein the first switch means comprises a PNP transistor whose emitter is connected to the power supply and the second switch means comprises a NPN transistor whose emitter is grounded,
   a collector of the PNP transistor is connected to the anode of the switch diode and a collector of the NPN transistor is connected to the other end of the first resistor, and
   a base of the PNP transistor is connected to the collector of the NPN transistor and the band switching voltage is applied to a base of the NPN transistor.

3. The band switchable type tuning circuit according to claim 1,
   wherein the first switch means, the second switch means, the second resistor and the third resistor are provided in an integrated circuit.

* * * * *